(12) United States Patent
Hong

(10) Patent No.: US 9,053,944 B2
(45) Date of Patent: Jun. 9, 2015

(54) SEMICONDUCTOR DEVICE AND MANUFACTURING METHOD THEREOF

(71) Applicant: Semiconductor Manufacturing International (Shanghai) Corporation, Shanghai (CN)

(72) Inventor: James Hong, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/179,847

(22) Filed: Feb. 13, 2014

(65) Prior Publication Data

US 2014/0312471 A1 Oct. 23, 2014

(30) Foreign Application Priority Data

Apr. 23, 2013 (CN) .......................... 2013 1 0142017

(51) Int. Cl.
*H01L 21/311* (2006.01)
*H01L 29/06* (2006.01)
*H01L 21/265* (2006.01)

(52) U.S. Cl.
CPC .............. *H01L 29/06* (2013.01); *H01L 21/265* (2013.01)

(58) Field of Classification Search
CPC ............ H01L 29/66795; H01L 29/785; H01L 21/823431; H01L 29/0657
USPC ................... 438/164, 737; 257/353; 148/33.3
See application file for complete search history.

(56) References Cited

U.S. PATENT DOCUMENTS

| | | | | |
|---|---|---|---|---|
| 2008/0173937 A1* | 7/2008 | Chung et al. | ................... | 257/329 |
| 2014/0183599 A1* | 7/2014 | Hong et al. | ................... | 257/190 |
| 2014/0322882 A1* | 10/2014 | Rodder et al. | ................ | 438/289 |
| 2015/0004766 A1* | 1/2015 | Tsai et al. | ..................... | 438/283 |

* cited by examiner

*Primary Examiner* — George Fourson, III
(74) *Attorney, Agent, or Firm* — Innovation Counsel LLP

(57) ABSTRACT

A semiconductor device has a plurality of closely spaced fins each coated at its top and sidewalls with a SiGe layer used for improving charge carrier mobility in a channel portion of the device. The sidewalls of the closely adjacent Fins are selectively thinned so as to prevent an undesired bridging of SiGe material between immediately adjacent ones of the Fins. A method of manufacturing the same comprises: providing a substrate having a plurality of tri-gate transistors, at least two fins of the tri-gate transistors being closely adjacent to each other, where respective top and sidewall surfaces of the fins are coated with a SiGe layer; performing a tilted ion implantation on the SiGe coated fins so as to partially convert the SiGe material into a predetermined etch resistant material (e.g., and oxide of the SiGe); and etching away the non-converted sidewall parts of the SiGe coating layers so as to provide greater spacing between the immediately adjacent sidewalls of the SiGe coated fins.

20 Claims, 4 Drawing Sheets

SEMICONDUCTOR DEVICE AND MANUFACTURING METHOD THEREOF

CROSS-REFERENCE TO RELATED APPLICATIONS

This application claims priority of Chinese Patent Application No. 201310142017.6, filed on Apr. 23, 2013, which application is incorporated herein by reference in its entirety.

FIELD OF DISCLOSURE

The present disclosure of invention relates to a semiconductor device and a method of manufacturing the same, in particular, to a semiconductor device capable of increasing space between SiGe layers overlapped on adjacent Fins of tri-gate transistors, and a method of manufacturing the same.

BACKGROUND

With the continuous development and improvement of semiconductor technology, the critical dimensions of features in monolithically integrated semiconductor devices tend to shrink. As a result of this tendency, problems emerge for nanometer regime transistor structures. For example, a tri-gate "Fin" type transistor is shown in FIG. 1 (not necessarily a FinFET—can be a junction FET instead). Here it will also be referred to as a 3D transistor. Contrary to the planar channel structure in a conventional 2D transistor, the latter is replaced by a super-thin 3D silicon fin which rises vertically from a silicon substrate. Control of conduction may be had around at least three sides of the channel rather than just one as was the case for conventional planar channel structures.

In the 3D transistors, the silicon fins are vertical so that even wide channel transistors may be placed more closely to each other. Thus a greatly increased packing density for transistors is made possible. Furthermore, and as alluded to above, in the 3D transistor, conduction control for the channel may be realized by mounting a respective one or more gate electrodes about each of the three raised faces (i.e. two sides and a top face of the fin), which is different from a 2D transistor wherein a gate is disposed only adjacent to the top face of the 2D channel structure. Such design of the 3D transistor allows more current to flow when the transistor is controlled via the gate to be in the "ON" state, and the current is reduced to approximately zero when the transistor is controlled via the gate to be in the "OFF" state. The 3D transistors can very quickly switch between the two states, thereby obtaining higher performance and efficiency.

An embedded SiGe process has been widely used in the manufacturing procedure of MOS transistors to increase the charge carrier mobility of the MOS transistors, both in the 2D transistors and 3D transistors.

However, with the miniaturization of CD (critical dimension), in the manufacturing procedure of the 3D transistors, as shown in FIG. 2, the deposited SiGe material around the adjacent fins in MOS transistors can be readily bridged with that of adjacent fins, so that the performance of the 3D transistors is deteriorated (for example due to shorting or capacitive cross-coupling between immediately adjacent SiGe layers).

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present disclosure of invention addresses the above-mentioned problem. An object of the present disclosure is to provide a semiconductor device having increased spacing between immediately adjacent sidewall of the fin overlapping SiGe layers of adjacent Fins in the tri-gate transistors. A method of manufacturing the same is also provided.

According to one aspect of the present disclosure of invention, a method of manufacturing a semiconductor device, comprises: providing a substrate having a plurality of tri-gate transistors, at least two fins of the tri-gate transistors being adjacent to each other, an outer surface of each fin having a SiGe coating layer with a top surface and a bottom surface, wherein for the top surface of the SiGe layer a first portion that is closer to the vertical projection axis of the fin is converted (e.g., by tilted ion implantation) into an etch resistant material (e.g., an oxide of the SiGe) and a second portion that is farther away from the vertical projection axis remains unconverted and thus susceptible to removal by a corresponding etch process; and etching away the exposed non-converted parts of the SiGe layers of said fins by using the implant-converted surface portions as etch masks.

In one embodiment, the method further comprises removing implanted SiGe regions after etching the exposed non-implanted parts of the SiGe layers of said fins.

In one embodiment, the tri-gate transistor may be one of a PMOS transistor and a NMOS transistor.

In one embodiment, the mask may be a self-aligned hard mask.

In one embodiment, the implantation may be tilted ion implantation based on implanting with at least one of N, O, Ar, Ge and C. An angle of said tilted ion implantation may be between 30 degrees and 60 degrees.

In one embodiment, said etching may be wet etching using tetramethyl-ammonium-hydroxide (TMAH).

In one embodiment, said etching may be dry etching using at least one of $Cl_2$, HF, HCL and HBr.

In one embodiment, said etching may be anisotropic etching using a bias power. Said bias power may equal to or more than 100 watts.

In one embodiment, said etching may be isotropic etching based on one of $CF_4$, $C_2F_2$ and $SF_6$ using a bias power. Said bias power may equal to or less than 100 watts.

In one embodiment, said etching may be a combination of wet etching and dry etching.

According to another aspect of the present disclosure of invention, there is provided a semiconductor device, comprising a substrate having a plurality of tri-gate transistors, at least two fins of the tri-gate transistors being closely adjacent to each other (e.g., within 50 nm or less of one another), an outer surface of each fin having a SiGe layer with a top surface and a bottom surface, wherein the top surface of the SiGe layer at least has a first top surface not adjacent to any other fins and a second top surface adjacent to another fin, and said second top surface is concave relative to said first top surface.

According to the semiconductor device and the method of manufacturing the same, the space between SiGe layers of adjacent Fins in the tri-gate transistors may be increased to improve the performance of the tri-gate transistors.

Other features and advantages of the present disclosure of invention will become apparent from the following detailed description of exemplary embodiments thereof, with reference to the drawings

BRIEF DESCRIPTION OF THE DRAWINGS

The accompanying drawings, which are incorporated in and constitute a part of the specification, illustrate embodiments of the present disclosure of invention and, together with the description, serve to explain the principles of the present teachings. The present teachings can be more clearly understood by reading the following detailed description with reference to the accompanying drawings.

Figure 1:
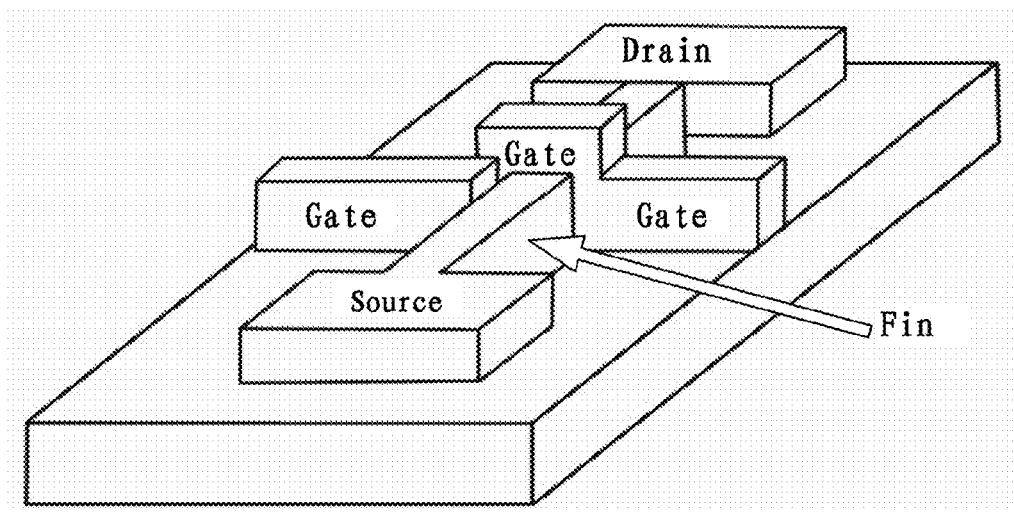
FIG. 1 is a schematic diagram showing a typical tri-gate transistor.

It should be understood that these drawings are merely illustrative in nature and are not intended to limit the scope of the present teachings. In the drawings, various components are not shown strictly in scale or according to their actual shapes, wherein, some of the components (such as, layers or parts) may be enlarged relative to others so as to more clearly explain the principles of the present teachings. Moreover, details that may obscure the gist of the present invention are not shown in the drawings.

DETAILED DESCRIPTION

Various exemplary embodiments in accordance with the present disclosure of invention will be described in detail below with reference to the accompanying drawings.

It should be noted that the relative arrangements of components and steps, mathematic expressions and numerical values set forth in these embodiments do not limit the scope of the present invention unless otherwise mentioned. Further, like reference numbers and letters denote like items in the following drawings. Thus, when one item is defined in one figure, it typically will not be further discussed in the subsequent figures.

The description of the exemplary embodiments below is merely illustrative, and does never limit the present disclosure of invention and its associated applications or uses. The well-known technologies in the art may be applied to parts not specifically shown and described herein. In all of examples shown and described herein, any specific values are construed as merely being illustrative but being non-limiting. Therefore, values other than those optionally provided in the exemplary embodiments may be used.

FIG. 1 is merely an introductory perspective and schematic view of a Fin type 3D transistor wherein the Fin provides a controllable channel region and one or more gate electrodes may be disposed about at least the three raised surfaces of the Fin for controlling current conduction through the channel region.

Figure 2:
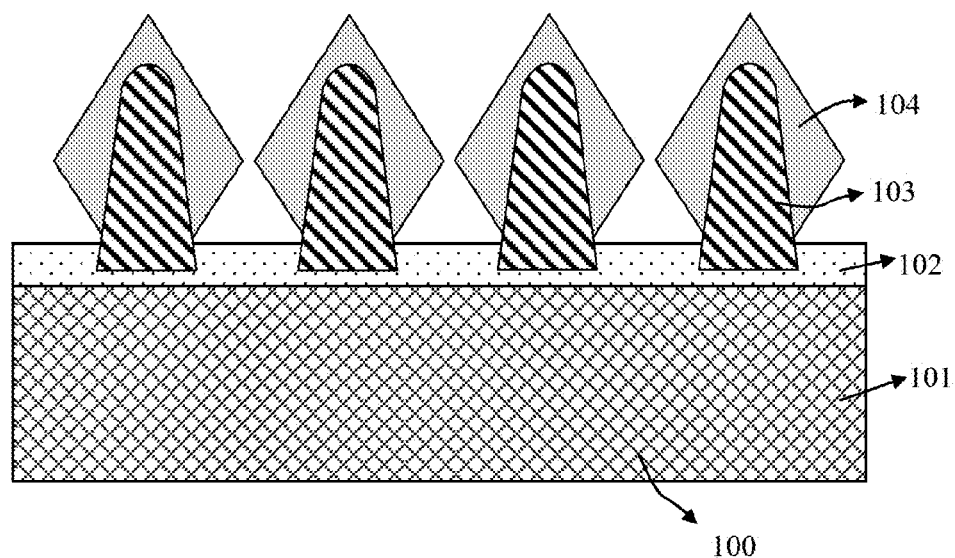
FIG. 2 is a schematic diagram showing a step of providing a substrate in a method of manufacturing a semiconductor device according to an embodiment of the present disclosure of invention.

FIG. 2 is a side cross section schematic diagram showing a manufacturing state in which SiGe material (of a predetermined composition of Si and Ge components) has between provided on a pre-patterned substrate (e.g., one having closely spaced apart Fins, e.g., a finite number of nanometers apart for example less than 100 nm apart or more specifically, less than about 50 nm apart) in a method of manufacturing a semiconductor device according to an embodiment of the present disclosure. As shown in FIG. 2, a bulk substrate is provided. The substrate 100 comprises a semiconductive bulk layer 101 (preferably a monocrystalline one such as monocrystalline silicon), a bulk-insulating oxide layer 102 formed into the bulk semiconductor layer 101 (for example, by a buried layer forming oxygen implant), and bulk-originated fins (also preferably of a monocrystalline semiconductor material same as that of the bulk layer 101) but disposed above the oxide layer 102 after the oxide layer 102 is formed. As mentioned, the semiconductor layer 101 may be formed from a semiconductor material such as monocrystalline silicon. For example, the oxide layer 102 is an oxidized layer of the original bulk silicon.

In some embodiments, the semiconductor bulk layer 101 may be a doubly insulated one which starts off as a SOI (Silicon-on-insulator) layer. In this latter case, the bulk substrate 100 may further comprise an additional insulator layer (not shown) within the bulk semiconductor layer 101. However, the present disclosure is not limited to this configuration.

It should be understood that although a form of SOI substrate is shown in FIG. 2, the present teachings may be applicable for a mono-crystalline silicon bulk substrate that does not include the illustrated oxide layer 102. Further, the present invention may also be applicable in a case where a semiconductor material other than silicon is used as a bulk substrate material and a plurality of closely spaced apart Fins are formed thereon and then it is desirable to add an additional and different material (corresponding to the SiGe overlap described here) onto the Fins while preventing bridging of the additional and different material of the closely spaced Fins.

Fins 103 are fins intended for forming closely spaced tri-gate transistors. The fins 103 may be made, for example, of mono-crystalline silicon. Although the tri-gate transistors may be one or both of PMOS transistors or NMOS transistors, in the here described embodiments, the description is made by taking the tri-gate transistors will be taken as being only PMOS transistors for sake of simplified example.

In FIG. 2, a SiGe layer is denoted by 104. In order to improve the mobility of the PMOS transistors, SiGe is overlapped and/or embedded into the exposed outer surfaces of the fins 103 by selective epitaxial growth (e.g., by vapor deposition) after optionally forming dummy gates for regions of the fins where such epitaxial growth is not desired and in the procedure of manufacturing the PMOS transistors, thereby forming the illustrated SiGe layers 104.

Because the epitaxial growth vapor self-impedes itself from reaching the deep trench bottoms of the fins as epitaxial growth proceeds, the roughly diamond shaped cross sections for the epitaxial grown SiGe 104 develop. More specifically, and as shown in FIG. 2, the distance between the roughly diamond shaped cross sectional portions of the grown SiGe layers of adjacent fins can be very narrow, thus occasionally causing the SiGe layers of two adjacent fins to be easily bridged with each other, and thereby deteriorating the performance of the being-formed PMOS transistors.

It is to be understood that although the SiGe layers 104 of fins 103 shown in FIG. 2 on a crystalline surface of for example (111) orientation are formed into a shape of diamond, the SiGe layers in accordance with the present disclosure of invention are not limited to this shape. For example, the SiGe layers on the crystalline surface of (111) may be formed into shapes such as those of closely-spaced rectangles, squares, ellipses, or the like.

Figure 3:
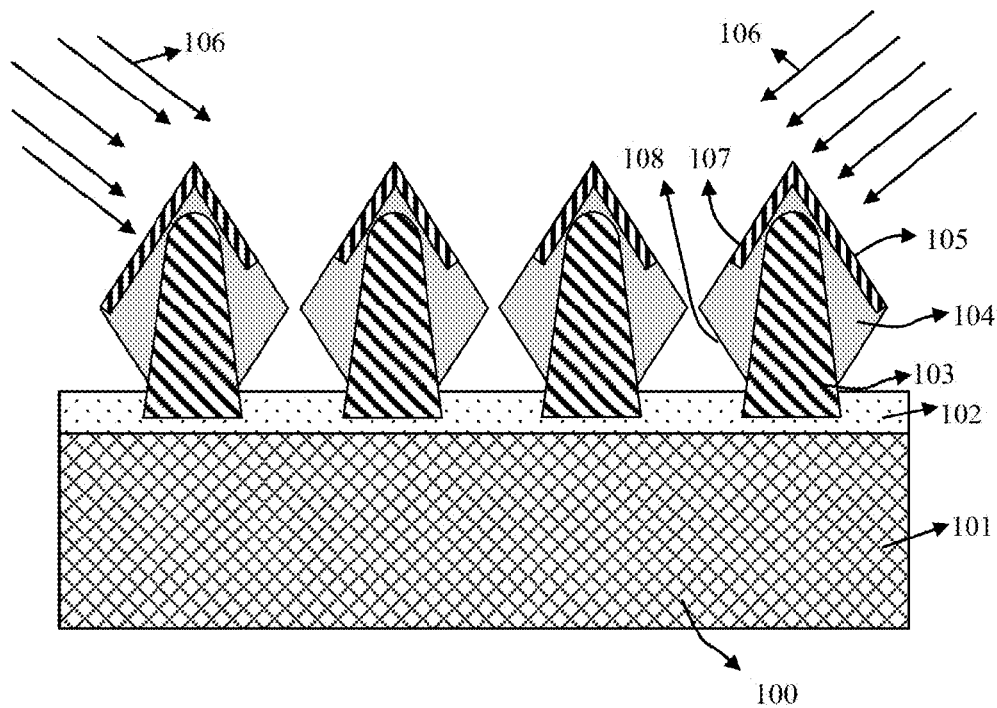
FIG. 3 is a schematic diagram showing a step of performing a tilted angle, mask-creating implant in accordance with the method of manufacturing a semiconductor device according to the present disclosure of invention.

Next, a step of performing a tilted-implant formation of etch masks ion in the method of manufacturing the semiconductor device according to the illustrated embodiment is shown in FIG. 3. The tilted implant 106 shown in FIG. 3, may introduce one or more of etch-mask forming moieties such as O, N, C, Ar or Ge for embedding into exposed upper surfaces of the SiGe layers 104 to thereby form etching mask layers 105 by means of such tilt implantation. In FIG. 3, a direction of tilt implantation is denoted by the arrows 106. Herein, the angle of tilt implantation is between 30 degrees and 60 degrees relative to the major surface of the bulk substrate 101. Although the tilt implantation is employed in this embodiment, other types of mask formation may be employed (e.g., non-tilted implantation).

Parts 107 on the top surfaces of the SiGe layers 104, which are not shielded by adjacent fins due to the shadowing effect, are implanted, and thus converted into selective etch masks. On the other hand, parts 108 below the higher top surfaces of the SiGe layers 104, are shielded by adjacent fins due to the shadowing effect, and are thus not implanted, and thus no mask layers are formed on the parts 108. As a result, the top surfaces of the SiGe layers 104 are divided into two portions, i.e. a well-masked portion and a substantially unmasked portion. Four fins are shown in FIG. 3. The top surface of the SiGe layer 104 of each fin is divided into two portions, a left portion and a right portion. That is, the top surfaces of the SiGe layers 104 are divided into eight portions, both leftmost and rightmost portions being referred to as isolated-side portions, and the remaining six portions being referred to as densely-packed side portions.

As shown in FIG. 3, the outer and isolated-side portions of the top surfaces of the SiGe layers 4 are completely covered by the etch mask layers 105, while the dense-packed side portions of the top surfaces of the SiGe layers 4 are only partially covered by the mask layers 105.

Next, a self-aligned anisotropic etching (a dry etching) is performed on the SiGe layers 1044 while using the mask layers 105 as selective etch masks to thereby selectively the unmasked parts of the SiGe layers 104. For example, using a reactive ion (RIE) etching gas mixture of $Cl_2$ and HBr, etching is applied to the SiGe layers 104 under the condition with a bias power of 100 to 200 watts and a source power of 400 to 800 watts. While dry etching using $Cl_2$ and HBr is mentioned herein, other processes of selective and anisotropic dry etching are well known to ordinary artisans of the relevant art and may be alternatively used.

Figure 4:
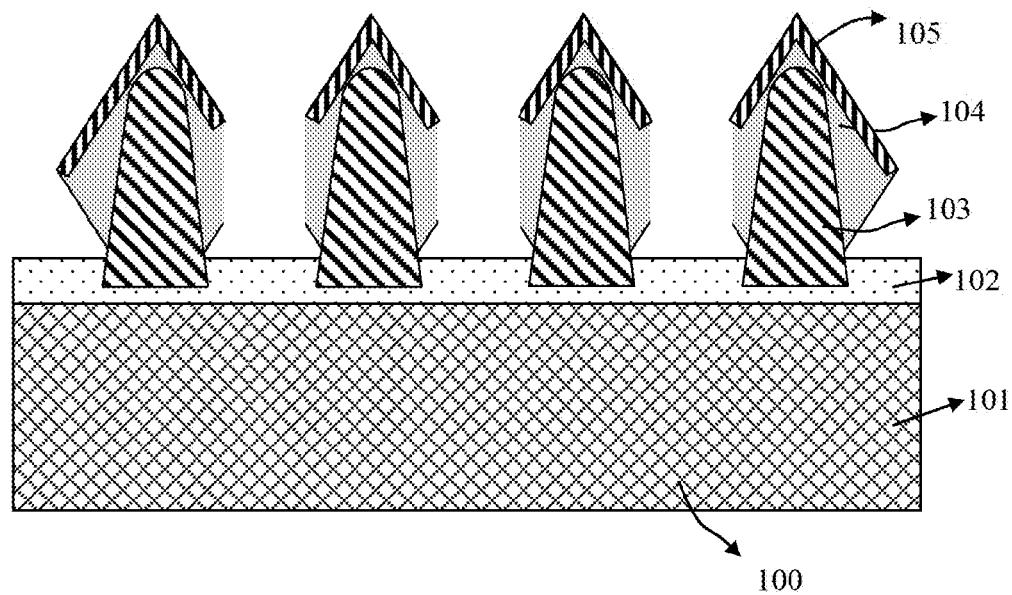
FIG. 4 is a schematic diagram showing a first example of a step of anisotropic etching using the etch masks created in FIG. 3 and in the method of manufacturing the semiconductor device.

As a result, and as shown in FIG. 4, the surfaces of the dense-packed sidewall portion of the SiGe layers where there is no mask shielding from the anisotropic dry etch are selectively etched away so that the distance between the remaining material of the SiGe layers of closely adjacent fins is increased. This prevents the SiGe layers of the two closely adjacent fins from being bridged, thus improving the performance of the PMOS transistors.

It is to be understood that FIG. 4 merely shows an example of the step of selective etching in the method of manufacturing the semiconductor device according to the present disclosure. Alternatively, the SiGe layers 4 may be etched using the etching method as shown in FIG. 5.

Figure 5:
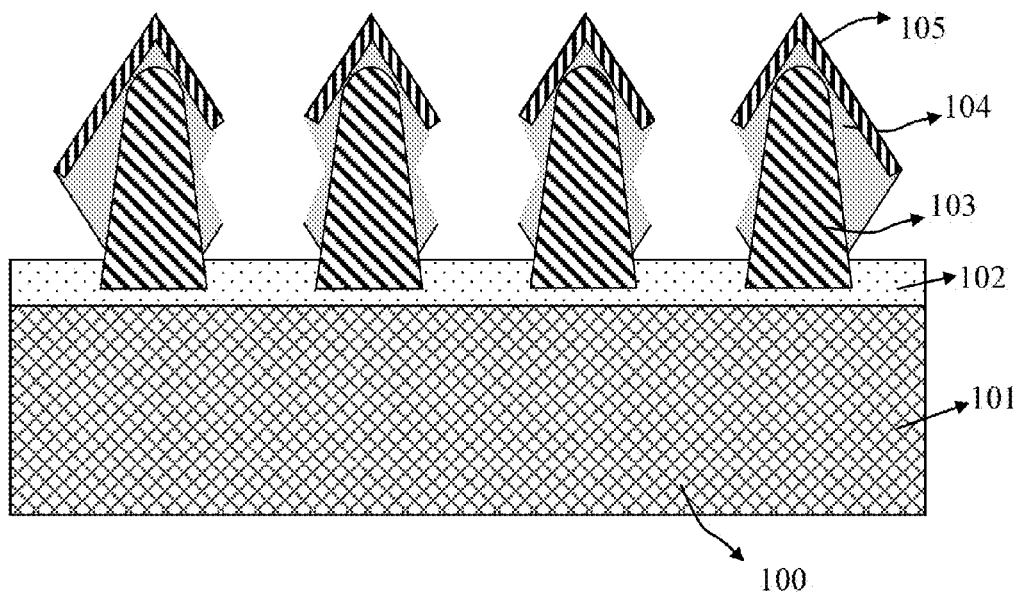
FIG. 5 is a schematic diagram showing a second example of the step of etching in the method of manufacturing the semiconductor device according to an embodiment.

More specifically, a crystal-orientation selective etching (wet etching) may be applied to the (111) epitaxially grown SiGe layers 104 by use for example of a tetramethyl-ammonium-hydroxide (TMAH)method while using the mask layers 105 to thereby obtain a resultant structure such as shown in FIG. 5. Here, selective wet etching using TMAH is only mentioned as an example and other processes of selective wet etching known to persons of ordinary skill in the art may be alternatively used.

Figure 6:
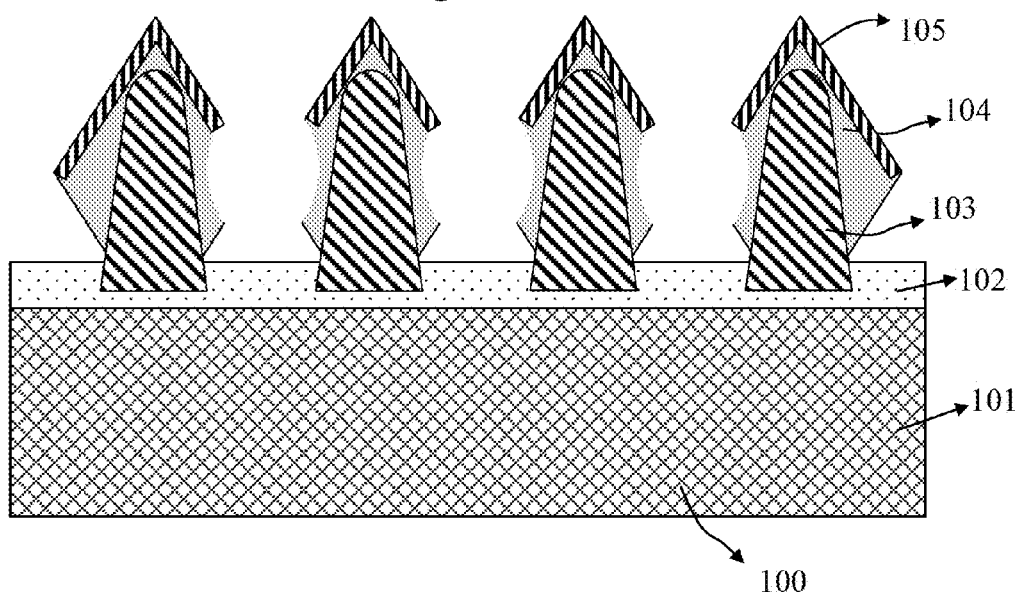
FIG. 6 is a schematic diagram showing a third example of the step of etching in the method of manufacturing the semiconductor device according to an embodiment.

Further, etching may be applied to the SiGe layers 104 using the combination of anisotropic dry etching and isotropic and/or crystal-orientation selective wet etchings. For example, using an etching gas mixture of $Cl_2$, HBr and $SF_6$, dry etching (RIE) is applied to the SiGe layers 104 under the condition with a bias power of 0 to 100 watts and a source power of 300 to 800 watts. As a result, a result shown in FIG. 6 may be obtained. This etching method is also referred to herein as "directly bowling etching".

Figure 7:
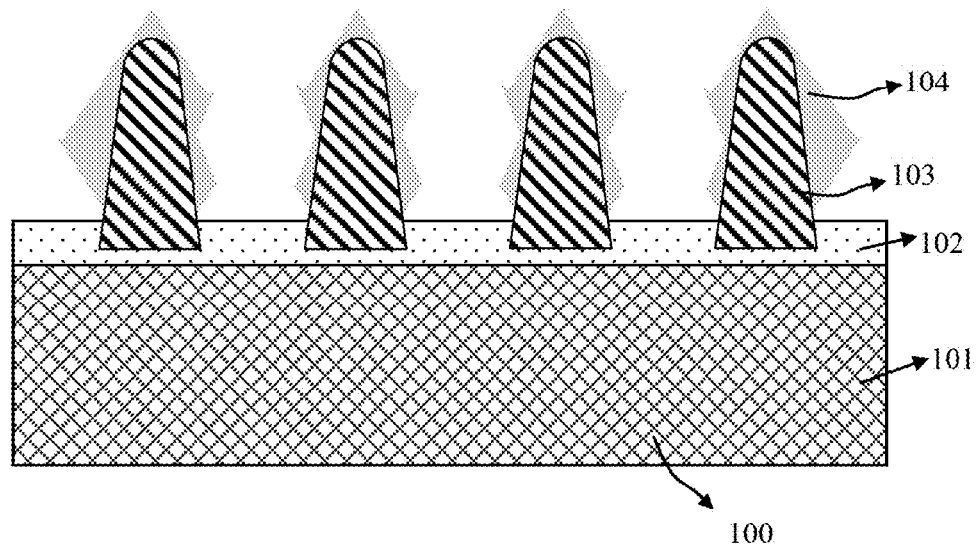
FIG. 7 is a schematic diagram showing the semiconductor device with a mask layer removed, corresponding to the example of FIG. 5.
Figure 8:
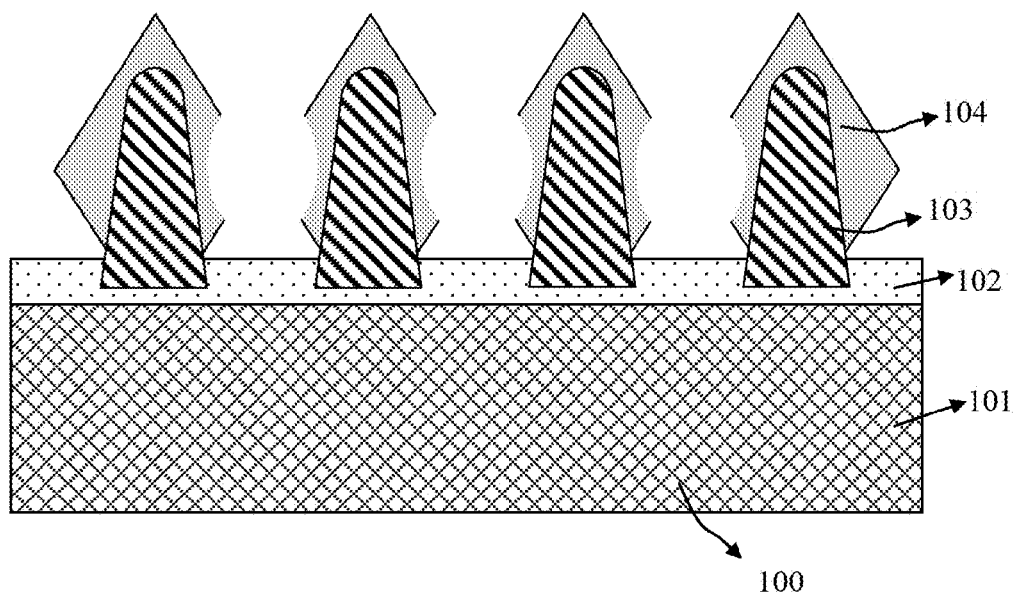
FIG. 8 is a schematic diagram showing the semiconductor device with a mask layer removed, corresponding to the example of FIG. 6.

Finally, if necessary, the mask layers 105 may be removed after the SiGe thinning etch or etches are carried out. FIGS. 7 and 8 are schematic diagrams of semiconductor devices in which the mask layers have been removed, and corresponding to FIGS. 5 and 6 as described above, respectively.

A variety of semiconductor devices and methods of manufacturing the same according to the present disclosure of invention have been described in detail above. So as to not obscure the concept of the present invention, some details well known in the relevant art have not been shown or described. For example, a gate insulating layer of appropriate thickness and composition may be deposited on the SiGe coated fins of respective FIGS. 7 and 8 whereafter the gate electrodes may be formed on the gate insulating layer portions for sake of forming corresponding field effect devices. Alternatively, the gate electrodes may be formed directly on the SiGe coated fins of respective FIGS. 7 and 8 in the case where junction controlled devices are being manufactured. From the above description, one ordinary person skilled in the art can completely understand how to implement the technical solutions disclosed herein.

Although the present teachings have been provided in detail with respect to the exemplary embodiments thereof, it should be understood by those of ordinary skill the art and in light of the foregoing that the above exemplary embodiments are only intended to be illustrative but not to limit the scope of the present teachings. It should be understood in light of the foregoing that the above exemplary embodiments can be modified without departing from the scope and spirit of the present teachings.

What is claimed is:

1. A method of thinly coating a plurality of closely spaced fins of a semiconductor device, the method comprising:
    providing a substrate having a plurality of closely spaced and semiconductive fins projecting vertically there above, wherein outer surfaces including respective top surfaces of the fins are coated with a convertible material different from that of the semiconductive fins and wherein the convertible material is chemically convertible into a predetermined etch resisting material;
    selectively converting respective portions of the respective convertible material coatings of the respective fins into the predetermined etch resisting material, where the converted portions are more adjacent to the respective vertical projection axes of the vertically projecting fins than are unconverted remaining portions of the convertible material coatings;

selectively etching away portions of the respective convertible material coatings that are not masked by the converted and thus etch resisting material to thereby cause the closely spaced semiconductive fins to be less thickly coated about their respective vertical projection axes by the convertible material.

2. The method of claim 1, wherein the convertible material coatings include SiGe layer coatings.

3. The method of claim 2, wherein the vertically projecting fins are silicon fins.

4. The method of claim 2, wherein the predetermined etch resisting material is at least one of an oxide of, a nitride of, a carbide of, or an argon impregnated version of a SiGe material of the SiGe layer coatings.

5. The method of claim 1, wherein the converting of the respective portions of the respective convertible material coatings of the respective fins into the predetermined etch resisting material includes implanting those to be converted portions with at least one of oxygen (O), nitrogen (N), carbon (C), argon (Ar), and additional germanium (Ge).

6. The method of claim 5, wherein the implanting includes using a tilted ion implant method.

7. The method of claim 1, wherein the selective etching away of the portions of the respective convertible material coatings that are not masked includes performing an anisotropic dry etch.

8. The method of claim 7, wherein the selective etching away of the portions of the respective convertible material coatings that are not masked further includes performing an isotropic wet etch.

9. The method of claim 1, wherein the selective etching away of the portions of the respective convertible material coatings that are not masked includes performing a crystalline orientation selective wet etch.

10. The method of claim 2, further comprising:
selectively removing the converted SiGe regions after selectively etching away the portions not masked by the etch resisting material.

11. The method of claim 10, wherein the closely spaced semiconductive fins that are so caused to be less thickly coated about their respective vertical projection axes by the convertible material are used to form tri-gate transistors of at least one of a PMOS transistor type and a NMOS transistor type.

12. The method of claim 6, wherein an angle of said tilted ion implantation is between 30 degrees and 60 degrees.

13. The method of claim 9 wherein said wet etch includes using tetramethyl-ammonium-hydroxide.

14. The method of claim 7, wherein said dry etch includes using at least one of $Cl_2$, HF, HCL, and HBr.

15. The method of claim 14, wherein said dry etch is a reactive ion one having a bias power equal to or more than 100 watts.

16. The method of claim 1, wherein said etching includes an isotropic dry etching based on one of $CF_4$, $C_2F_2$, and $SF_6$ and using a bias power equal to or more than 100 watts.

17. A semiconductor device, comprising
a semiconductor substrate having a plurality of same material fins projecting vertically there above, wherein outer surfaces including respective top surfaces of the fins are coated with a convertible material different from that of the semiconductive fins and wherein the convertible material is chemically convertible into a predetermined etch resisting material;
wherein the respective coatings of the respective fins include concave sidewalls.

18. The semiconductor device of claim 17 wherein:
the convertible material coatings include SiGe layer coatings.

19. The semiconductor device of claim 17 wherein the vertically projecting fins are silicon fins.

20. The semiconductor device of claim 18 wherein: the predetermined etch resisting material is at least one of an oxide of, a nitride of, a carbide of, or an argon impregnated version of a SiGe material of the SiGe layer coatings.

* * * * *